US006539527B2

(12) United States Patent
Naffziger et al.

(10) Patent No.: US 6,539,527 B2
(45) Date of Patent: Mar. 25, 2003

(54) SYSTEM AND METHOD OF DETERMINING THE NOISE SENSITIVITY OF AN INTEGRATED CIRCUIT

(75) Inventors: Samuel D. Naffziger, Ft. Collins, CO (US); John D Wanek, Denver, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 41 days.

(21) Appl. No.: 09/812,661

(22) Filed: Mar. 19, 2001

(65) Prior Publication Data

US 2002/0174408 A1 Nov. 21, 2002

(51) Int. Cl.[7] ................................................. G06F 9/45
(52) U.S. Cl. ............................................. 716/5; 716/11
(58) Field of Search .................... 716/5, 11, 12, 716/6, 19, 8, 13, 14

(56) References Cited

U.S. PATENT DOCUMENTS

| | | | | |
|---|---|---|---|---|
| 5,198,986 A | * | 3/1993 | Ikeda et al. ................ | 716/11 |
| 5,481,695 A | * | 1/1996 | Purks ......................... | 703/15 |
| 5,535,133 A | * | 7/1996 | Petschauer et al. ......... | 361/774 |
| 5,555,506 A | * | 9/1996 | Petschauer et al. ......... | 703/13 |
| 5,596,506 A | * | 1/1997 | Petschauer et al. ......... | 716/5 |
| 5,610,833 A | | 3/1997 | Chang et al. ............... | 716/11 |
| 5,946,482 A | | 8/1999 | Barford et al. ............. | 703/14 |
| 6,018,623 A | | 1/2000 | Chang et al. ............... | 716/6 |
| 6,058,256 A | * | 5/2000 | Mellen et al. .............. | 716/12 |
| 6,061,222 A | | 5/2000 | Morris et al. .............. | 361/111 |

OTHER PUBLICATIONS

Tabak, Daniel, "Advanced Microprocessors,"McGraw–Hill Inc. New York. (1991) 209–251.
De Blasi, Mario. "Computer Architecture," Addison–Wesley Publishing Co. New York. (1990) 261–291.
Vladimirescu, A., et al. "SPICE Version 2G6 User's Guide" (Oct. 1, 1983)1–32.
"Spice 3 User's Manual." pp. 1–138.

* cited by examiner

Primary Examiner—Tuan T. Lam
Assistant Examiner—Cassandra Cox (57) ABSTRACT

The present invention includes an apparatus and a method of designing integrated circuits in which the susceptibility of the integrated circuit to noise is estimated by analyzing the components of the circuits. Suspected noise susceptibility factors were investigated to determine the effects of various potential factors on noise characteristics. It was determined that percent of "bad" capacitance to total capacitance of wire coupling pairs of components, the total length of the corresponding wires between pairs of components that are subject to capacitive coupling and driver output impedance of driving circuits each contributed significantly to noise factors in integrated circuits. It was also determined that the integrated circuit being analyzed can be analyzed as pairs of coupled components (drivers, receivers an interconnections between drivers and receivers) to which the noise susceptibility factors can be applied and used to determine the overall susceptibility of noise of the circuit.

16 Claims, 5 Drawing Sheets

SYSTEM AND METHOD OF DETERMINING THE NOISE SENSITIVITY OF AN INTEGRATED CIRCUIT

RELATED APPLICATIONS

The present invention is related to commonly assigned, concurrently filed U.S. patent application Ser. No. 09/812,660, entitled "SYSTEM AND METHOD OF DETERMINING THE NOISE SENSITIVITY CHARACTERIZATION FOR AN UNKNOWN CIRCUIT," the disclosure of which is hereby incorporated herein by reference.

TECHNICAL FIELD

This invention generally relates to microprocessor and integrated circuit design techniques and specifically relates to the characterization of the noise sensitivity of integrated circuits.

BACKGROUND

Signal noise, line loading, and line coupling all contribute to signal degradation and cause much concern in the design and production of high speed Very Large Scale Integrated (VLSI) circuits. The effects of these phenomena are especially troublesome in the design of circuitry comprising numerous closely packed signal lines and densely packed logic circuits. To achieve minimum size and maximum design of integrated circuits involves a lengthy phase of design optimization followed by multiple design iteration. During design validation, a database representing the proposed integrated circuit is used to model the proposed silicon integrated circuit as closely as possible before a prototype or production integrated circuit is manufactured. The model of the integrated circuit is used to test and verify performance of the design and to identify and avoid potential and actual problems and the issues which are expected to occur once the integrated circuit is manufactured.

In accordance with Moore's law, miniaturization of the integrated circuits and the wires which connect the various transistors on an integrated circuit must support the doubling of circuit density every 18 months. State of the art processors utilizing 0.18 micron and smaller feature sizes, cramming tens-of-millions of transistors on a single die have between six and eight layers of metal used for wires interconnecting the underlying logic and transistors. In an effort to reduce the resistance associated with these wires, the width of the wires has been decreased to maintain compatibility with ever decreasing feature sizes, while the individual wires have grown in height. This reduced resistance allows an increase in connecting speed between transistors. However, these modifications in the width and height of the wires also affect interferences associated with neighboring wires.

In densely packed 0.18 micron and smaller integrated circuits, the capacitance effects between neighboring wires is difficult to accurately predict. Capacitance effects between wires can be impacted by a change in the direction of current in neighboring wires, the amount of current in neighboring wires, and the accumulative effects of neighboring wires within a specific distance. This interference is the result of the parasitic capacitance which is a product of the electric field between wires. This static electric field is caused by a voltage potential between two conductors when an insulator is located between the two conductors, resulting in capacitor coupling of the wires.

Capacitance loading can also have an adverse effect on signals carried on wires which were intended to maintain a constant voltage. The capacitance loading will effectively superimpose an additional current on the wire that is required to maintain the constant voltage and may result in a voltage spike which must be absorbed by the components (e.g., signal driver or signal receiver) connected to this wire. These voltage spikes may result in circuit failures. A wire in a VLSI circuit is usually viewed as having a driving circuit (a driver), the wire, and one or more receiving circuit (a receiver). If these voltage spikes reach the receivers connected to the effected or victim wire, which are required to maintain a constant voltage, the receiver may switch states within the dense wire environment of an integrated circuit resulting in a circuit failure.

If these loading effects are identified early, they may be prevented by spacing the wires further apart, increasing the driver strength (e.g., current driving capacity) or by making the receiver less sensitive to a voltage spike. Sensitivity to noise or noise problems are typically identified by the receiver's response to the voltage spike. If the receiver ignores the voltage spike the noise problem may be ignored, because it does not cause a malfunction in the integrated circuit. However, if the voltage spike causes an adverse reaction in the receiver, the interference is at such a level that it must be resolved.

Systems and methods for investigating electrical characteristics of a multi-level interstructure are known. Such systems use complicated algorithms for simulating a circuit. The process is complicated by the fact that adjacent interconnects, or wires, sometimes follow non-parallel paths. Another complexity is that there is a non-linear relationship between some process variables and electrical characteristics. For example, the relationship between capacitance and the space between adjacent interconnects, or wires, is non-linear. Consequently, the computation and simulation procedures are complex and are typically performed using Electrical Design Automation (EDA) tools. For example, HIVE is a software package that performs 2D numerical field simulations for interconnects having given geometries to arrive at the closest-fit analytical functions. As another example, Simulation Program with Integrated Circuit Emphasis (SPICE) is a software package that is commercially available for simulating inter alia electrical performance of complex Very Large Scale Integrated (VLSI) chips. SPICE requires inputs in the form of a SPICE subcircuit datafile, known in the art as a "SPICE deck" which numerically characterizes and describes the value and type of every conductor and component of the VLSI chip.

Many common computer simulators are also variations of the simulator tool SPICE. These programs typically operate by accepting circuit frequency response parameters, either directly from a Computer Aided Design (CAD) package, a simulator (using discrete frequencies to directly measure frequency response of a circuit prototype) or other means. Based upon these parameters, the simulator is then typically used to, simulate special signal conditions for the circuit which are usually not discrete frequencies, i.e., to predict transit responses in an integrated circuit. The computer based simulator typically use numbers which represent test input signals, e.g., initial voltages, currents and frequencies. The simulators are then usually used to conduct a time based analysis of responses to the input signal conditions of the different measurement points of the circuit. These tools can be used to determine the noise characteristics and sensitivity of circuit designs.

While numerous SPICE simulations can accurately simulate the operation of the integrated circuit, the required number of SPICE simulations is expensive both financially and computationally. The SPICE simulator accurately simulates wires and circuits with respect to their voltage and current behavior. However, in order to identify potential noise problems on an integrated circuit, numerous SPICE simulations must be performed. In these numerous SPICE simulations, variables such as the switching speed of neighboring wires, the distance between the aggressor wire and the victim wire, the length of the victim wire which runs parallel to the aggressor wire, the strength of the driver, and the sensitivity of the receiver must all be known and possibly varied to adequately investigate the potential noise problem. To accurately determine the extent of the noise problem in a typical LSI or VLSI circuit literally millions of SPICE iterations would need to be performed. Normally, simplifying assumptions are made to reduce the number of SPICE iterations which must be performed. These simplifying assumptions may impose restrictions upon the design itself. For example, restrictions may be imposed on wire spacing, the number of stages of inverters used to reject voltage spikes in receivers, the shielding required to reduce or eliminate line capacitance, and other such integrated circuit design limitations may be imposed. These limitations may result in a less than optimal design.

SUMMARY OF THE INVENTION

A need exists for a system and methodology that will analyze integrated circuits with "SPICE-like" accuracy at a fraction of the cost and computational intensity required by SPICE or similar full-featured circuit simulator. A further need exists for the identification of interference determining parameters or criteria that can be used to classify receivers within an integrated circuit as either being susceptible to noise interference or predicted to be operating within their design limitations.

This need and other features and technical advantages are achieved by a method of designing an integrated circuit which includes the steps of determining a layout of components of the integrated circuit and identifying noise susceptibility factors for pairs of the coupled components included in the layout. These noise susceptibility factors are then used to access predetermined noise characteristics to predict the noise characteristics of the integrated circuit. The step of identifying pairs of the components may further include the steps of identifying a driver, a receiver, and an interconnection therebetween. The step of identifying noise susceptibility factors may include the steps of determining a percent of "bad" capacitance to total capacitance of wire coupling the pairs of components; and determining the noise characteristics using the percent of capacitance. The step of identifying noise susceptibility factors may include the steps of calculating a total length of each corresponding wire coupling the pairs of components that are subject to capacitive coupling; and determining respective noise characteristics using each of the total lengths. The step of identifying noise susceptibility factors may include the steps of calculating a driver output impedance of driving circuits, where each driving circuit comprising one of the components of each of the pair of coupled components; and determining the noise characteristics using the respective driver output impedances. The step of identifying noise susceptibility factors may include the steps of determining a percentage of bad capacitance to total capacitance of a wire connecting the pairs of components; calculating a total length of each of corresponding wires coupling said pairs of components; calculating a driver output impedance of driving circuits each comprising one of the components of each of the pair of coupled components; and determining respective noise characteristic using the percentage of a bad capacitance to total capacitance, the effective total length of wire and the driver output impedance. The step of generating the prestored noise characteristics as a function of the noise susceptibility factors may also be included.

Another embodiment of the invention includes a tool for the design of an integrated circuits which includes an integrated circuit layout tool providing an integrated circuit layout which includes a plurality of pairs of coupled components where each pair is coupled by a respective wire. The tool may also include a noise calculation tool which provides noise susceptibility factors for each of the coupled components in the circuit layout; and a noise calculation tool which provides parameter noise characteristics of each of the wires using a prestored value retrieved as a function of the noise susceptibility factors. The integrated circuit layout tool may include semiconductor devices. The noise calculation tool may include the percent of a bad capacitance to total capacitance of a wire coupling the pairs of components. The noise calculation tool may include an effective total length of each of corresponding wires coupling the pairs of components that are subject to parasitic capacitance. The noise calculation tool may also include a driver output impedance of driving circuits each comprising one of the components of each of the pairs of coupled components and the percent of capacitance of wire coupling the pair of components. The noise calculation tool may also include an effective total length of each of corresponding wires coupling the pairs of components that are subject to parasitic capacitance and a driver output impedance of driving circuits each comprising one of the components of each of the pair of coupled components.

Another embodiment of the present invention includes an integrated circuit formed by the steps of specifying a layout of components included in the integrated circuit in which coupled pairs of the components are identified and noise susceptibility factors for the pairs of coupled components is also identified. The noise susceptibility factors may be used to retrieve prestored noise characteristics. The pairs of coupled components may further include a driver, a receiver, and an interconnection between the two. The noise susceptibility factors may include the percent of bad capacitance to total capacitance of a wire coupling the pairs of components, and an effective total length of each of corresponding wires coupling the pairs of components that are subject to bad capacitance coupling. The noise susceptibility factors may further include a driver output impedance of driving circuits each comprising one of the components of each of the pair of coupling components, It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1:
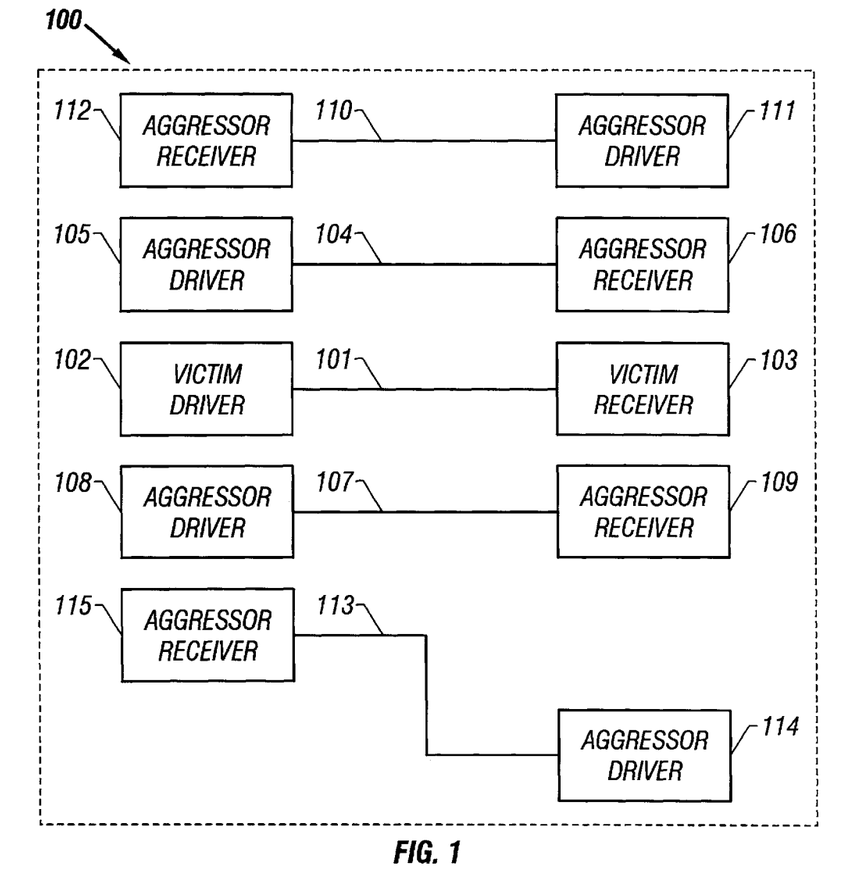
FIG. 1 is a diagram illustrating a simplified example of a victim wire which is affected through capacitive coupling from nearby aggressor wires.

FIG. 1 is a diagram depicting a simplified example of a number of wires and their components 100 in which a wire 101 may be affected through capacitive coupling or loading by other, adjacent wires and signals. As previously described, a wire in a VLSI design can be classified as having a driver circuit (driver) providing a signal, the interconnect or wire communicating the signal, and one or more receiving circuits (receiver) detecting the transmitted signal. Wire 101 may therefore be referenced as a "victim" wire 101 when subject to analysis. Thus, victim wire 101 is connected to a victim driver 102 and a victim receiver 103.

FIG. 1 also shows additional wires in the vicinity of victim wire 101 which may result in capacitance loading or coupling with wire 101. The wires or components which cause capacitance loading or coupling are designated as aggressor wires or components. FIG. 1 shows aggressor wire 104 immediately adjacent to one side of victim wire 101 which is connected to aggressor driver 105 and aggressor receiver 106. A second aggressor wire 107 located on the other side of wire 101 is connected to aggressor driver 108 and aggressor receiver 109. Capacitance coupling affects on victim wire 101 are not limited to affects from wires 104 and 107. As also shown in FIG. 1, aggressor wire 110, connected to aggressor driver 111 and aggressor receiver 112 and aggressor wire 113, connected to aggressor driver 114 and aggressor receiver 115 may also have an affect on victim wire 101.

The affects from aggressor wires 110 and 113 as diagramed may reduce the capacitive loading affects of aggressor wires 104 and 107 because of the orientation of the associated drivers and receivers. Additionally, one of ordinary skill in the art would understand that the affects of aggressor wire 113 will be reduced as compared to the affect of wire 110 because of the shorter span of aggressor wire 113 which runs parallel to victim wire 101 (again as compared to the longer length of aggressor wire 110 which runs parallel to victim wire 101). These comparisons assume that all other capacitance coupling factors are identical between aggressor wire 110, aggressor driver 111 and aggressor receiver 112 with aggressor wire 113, aggressor driver 114 and aggressor receiver 115, and that the differences are limited to the different lengths of the two aggressor wires which run parallel to victim wire 101.

If victim receiver 103 requires a constant voltage signal to be supplied from victim driver 102, via victim wire 101, capacitance loading bleeding part of the signal or capacitance coupling adding to the signal level may cause victim wire 101 to vary the signal voltage supplied to victim receiver 103. The capacitance loading or coupling affecting signal levels on victim wire 101 may be the result of a combination of the effects of signals on aggressor wire 104, aggressor wire 107, aggressor wire 110, aggressor wire 113, or any other components, interconnects, or wires in the vicinity of victim wire 101. One of ordinary skill in the art would understand the parasitic capacitance in the form of capacitance loading or capacitance coupling is not limited to aggressor wire 104 and aggressor wire 107.

Prior art tools such as SPICE simulate circuits and their signals including an analysis of capacitive coupling and other noise. This analysis is performed for each discrete signal frequency or continuous ranges of frequencies within a specified frequency range of interest and a noise value is calculated which corresponds to the spectral density of the circuit variables when viewed as a stationary gaussian stochastic process. Once the spectral densities are calculated, a noise analysis integrates these values over the specified frequency range to arrive at the total noise voltage/current.

In order to perform a noise analysis, SPICE requires the circuit under analysis to be described as a set of element lines, where the element lines define the circuit topology and the element values, and a set of control lines which define the model parameters and the run control. The element lines contain the element name, the circuit nodes to which the element is connected, and the values of the parameters that are used to determine the electrical characteristics of the element. Most simple circuit elements typically only require a few parameter values, while semiconductor devices typically require many parameter values. For example to simulate a Bi-polar Junction Transistor (BJT), SPICE uses a model which is an adaptation of the integral charge control model of Gummel-Poon. When certain parameters are not provided to SPICE, the model simplifies to the Ebers-Moll model BJT. Table 1 shows the parameters used by SPICE, and supplied by the user for a BJT transistor for the modified Gummel-Poon model.

TABLE 1

Parameters Used By SPICE (supplied by the user) For A BJT Transistor For The Modified Gummel-Poon Model include transport saturation current
ideal maximum forward beta
forward current current emission coefficient
forward Early voltage
corner for forward beta high current roll-off
B-E leakage saturation current
B-E leakage emission coefficient
ideal maximum reverse beta
reverse current emission coefficient
reverse Early voltage
corner for reverse beta high current roll-off
B-C leakage saturation current
B-C leakage emission coefficient
zero bias base resistance
current wear base resistance falls halfway to its minimum value
minimum base resistant at high currents
emitter resistance
collector resistance
B-E zero-bias depletion capacitance
B-E built-in potential
B-E junction exponential factor
ideal forward transit time
coefficient for bias dependence of TF
voltage describing VBC dependence of TF
high-current parameter for effect on TF
excess phase at frequency = $1.0/(TF*2PI)Hz$
B-C zero-bias depletion capacitance
B-C built-in potential
B-C junction exponential factor
fraction of B-C depletion capacitance connected to internal base node

TABLE 1-continued

Parameters Used By SPICE (supplied by the user) For
A BJT Transistor For The Modified Gummel-Poon
Model ideal reverse transit time
zero-bias collector-substrate capacitance
substrate junction built-in potential
substrate junction exponential factor
forward and reverse beta temperature exponent
energy gap for temperature effect on IS
temperature exponent for effect on IS
flicker-noise coefficient
flicker-noise exponent
coefficient for forward-biased depletion capacitance
formula
parameter measurement temperature In a similar manner, 15 parameters are required for a diode, 14 parameters are required for a JFET model, 42 parameters are needed for a MOSFET model, 13 parameters are required for a MESFET model and so on. Additional SPICE information is available in the SPICE user's manual, particularly in Appendix B entitled "Model And Device Parameters."

Line-to-line coupling noise which may distort signals supplied to victim receivers is of primary concern in predicting electrical failures in modern circuits. Line-to-line coupling noise can be characterized from four key elements including: the percentage of capacitance effects on a signal that come from aggressor signal lines that switch when this victim signal is being held at a constant voltage level; the output impedance of the driving circuit; the length of the victim line; and the nature of the receiver. The first element, percentage of capacitance on the signal that comes from aggressor signals that switch when this victim signal is attempting to hold a constant voltage, hereinafter called "bad capacitance," is greatly effected by wire spacing and proximity to supply shields. Another effect of "bad capacitance" is an increase in coupling noise percentage resulting in an increased noise margin. With respect to the second element, output impedance of the driving circuit, one of ordinary skill in the art would understand that the lower the impedance of the victim driving circuit, the better the victim driver will tolerate and mitigate any signal coupled to the victim wire and thereby minimize any adverse effect on the victim receiver. With respect to the third element, as the length of the victim line increases so does the resistance to the charge received from the aggressor wires which serves to increase the magnitude of the voltage applied to the receiver. Finally, the fourth element, the nature of the receiver, includes the trip point (i.e., domino gates trip at NFET Vt etc.), multi-input behavior (i.e. all inputs to a NOR could bias the NOR in such a way which greatly increases its sensitivity to spurious signals), output load, and number of stages (i.e., a buffer provides more noise immunity than an inverter).

Noise characteristics for a specific receiver can therefore be determined as a function of three factors: percentage of coupling capacitance (bad cap), output impedance of the driving circuit (strength of driver), and length of victim line (route length). Using these three factors, a three dimensional matrix of a circuit's response to stray capacitance can be produced. In a preferred embodiment, this matrix is further dependent on two assumptions. First, it is assumed that the wires are made of M3. Since M3 has the worse coupling behavior as a function of length, higher layers of metal (those with better coupling behavior as a function of length) will report maximum noise values for shorter length wires than is actually observed. The second assumption is that the driver strength minimum is set at 8 μm/pf for NFETs and 21 μm/pf for PFETs.

Figure 2:
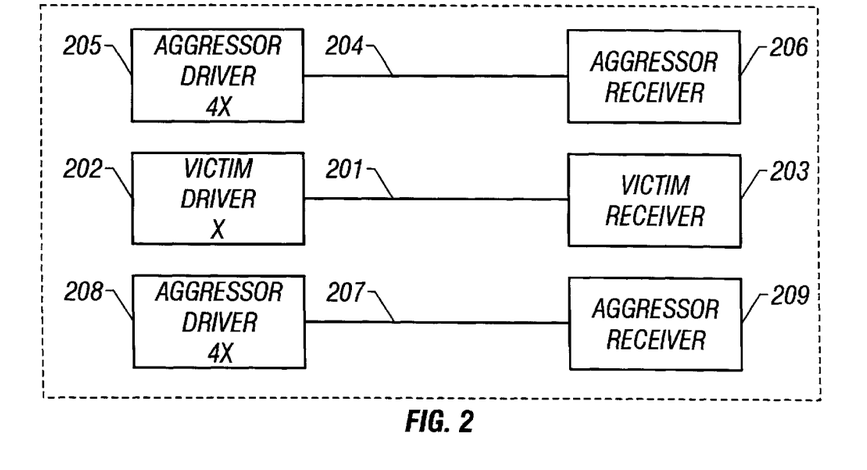
FIG. 2 is a circuit diagram used to model a victim wire for determining noise characteristics in the presence of aggressor wires.

FIG. 2 is a diagram of a circuit used for the characterization of noise sensitivity for a victim wire 201. Victim wire 201 is connected to victim driver 202 of strength "X" and victim receiver 203. As shown, the victim line 201 is formed between two aggressor lines 204 and 207. Aggressor line 204 is connected to aggressor driver 205 of magnitude 4X and aggressor receiver 206. Aggressor line 207 is connected to aggressor driver 208 also of magnitude 4X and aggressor receiver 209. For example, if the victim driver is a NFET, its strength would be 8 μm/pf and aggressor driver 205 and 208 would each be 32 μm/pF. Alternatively, if victim driver is a PFET, victim driver strength "X" would be 21 μm/pF and both aggressor driver 205 and aggressor driver 208 would each have a magnitude of 84 μm/pF.

The noise characteristics are created by applying a transition on the aggressor wire while keeping the victim wire at a constant value. The noise response is measured at the output of the victim receiver and is in the form of an excursion, or variance, from the quiescent, or steady state voltage. The magnitude of the voltage excursion is stored for each value of % bad capacitance, length, and driver size. After the transition on the aggressor wire has been terminated, the voltage on the victim output may or may not return or recover to the initial quiescent value.

A number of separate simulations are performed which typically encompass the following cases: aggressor transitioning from low to high with the victim attempting to hold the voltage high; aggressor transitioning from low to high with the victim attempting to hold the voltage low; aggressor transitioning from high to low with the victim attempting to hold the voltage high; and aggressor transitioning from high to low with the victim attempting to hold the voltage low. These simulations are performed, by way of example, in a computer sized for the application as desired.

Figure 3A:
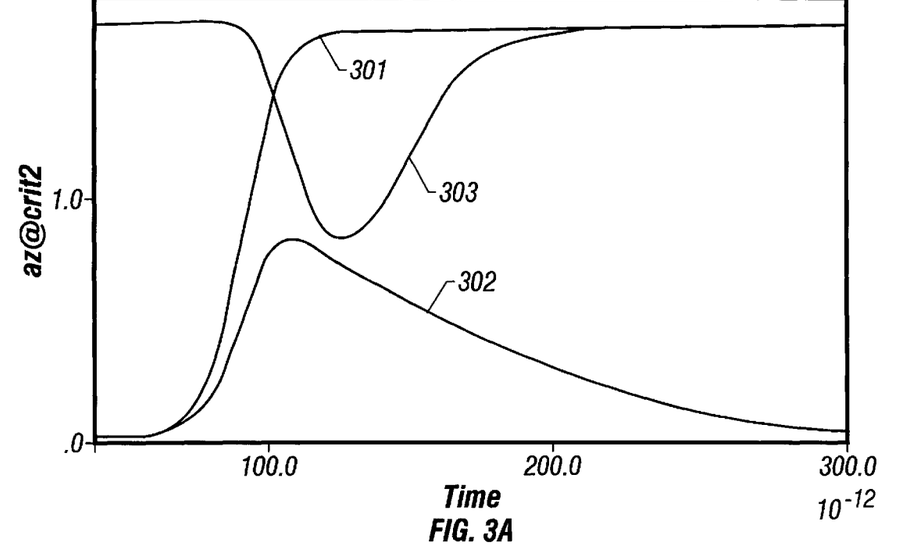
FIG. 3A is a SPICE simulation plot.

FIG. 3A is a plot of SPICE simulation showing a transient case. In FIG. 3A aggressor 301 is transitioning from low to high while victim receiver input signal 302 is configured to maintain a low voltage. The effect of voltage on victim receiver input 302 propagates through the victim receiver and the noise can be observed on victim receiver output 303. When victim receiver output 303 droops a specified voltage below the supply rail, or VDD, a failure occurs.

Figure 3B:
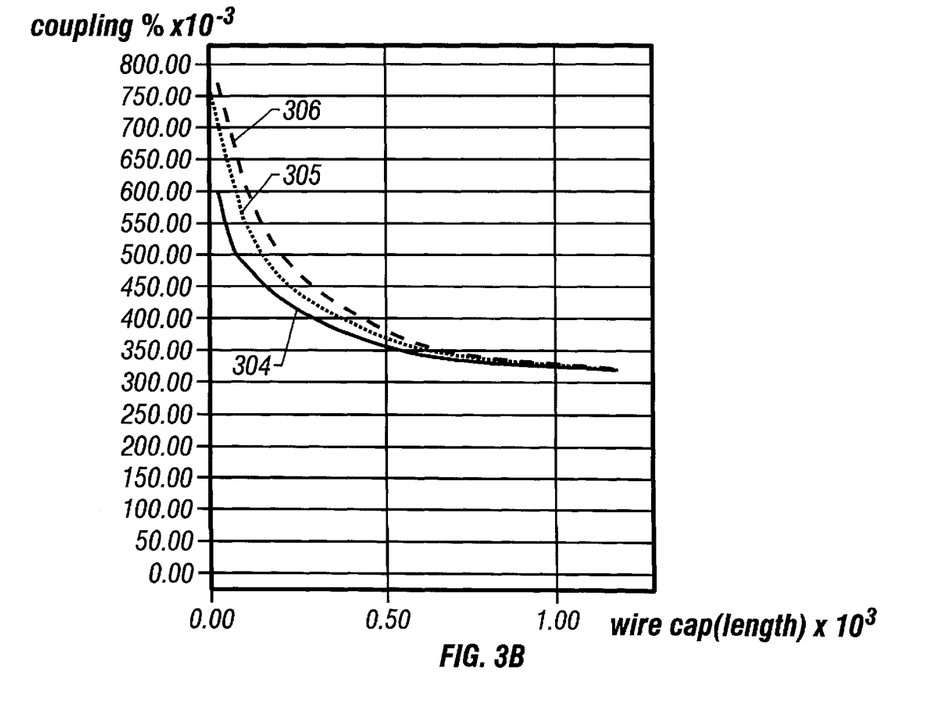
FIG. 3B is a plot of characterization results.

FIG. 3B is a plot of the noise characterization results for a particular receiver. The "x" axis represents the wire capacitance and the "y" axis is a fraction of bad capacitance. Curve 304 shows the maximum bad capacitance when the driver is equal to $2\frac{1}{8}$ μm/pf.

Curve 305 shows the maximum bad capacitance percentage when the driver is equal to $\frac{37}{14}$μm/pf and curve 306 shows the maximum bad capacitance percentage when the driver is equal to $\frac{52}{20}$μm/pf Values of bad capacitance below the curve for a given driver size are passing conditions.

SPICE calculations are then performed for this configuration while varying the wire lengths, the percentage of coupling capacitance (or bad cap) as well as the victim driver strength from the minimum values previously discussed (8 μm/pf for NFET and 21 μm/pf for PFETs) to twice the minimum values. As the values of victim driver strength are changed so are the corresponding aggressor driver strengths. Once these SPICE calculations are performed, the noise characteristics for a specific receiver can be applied as a function of the route length, the percentage of coupling capacitance and the strength of the driver without having to recalculate values using a SPICE simulator. Thereafter the precalculated noise characteristics for receivers as a function of route length, bad capacitance and driver strength allows the evaluation of the noise characteristics of an overall circuit, and the identification of required circuit updates to reduce noise characteristics, in a shorter amount of time and effort.

Figure 3C:
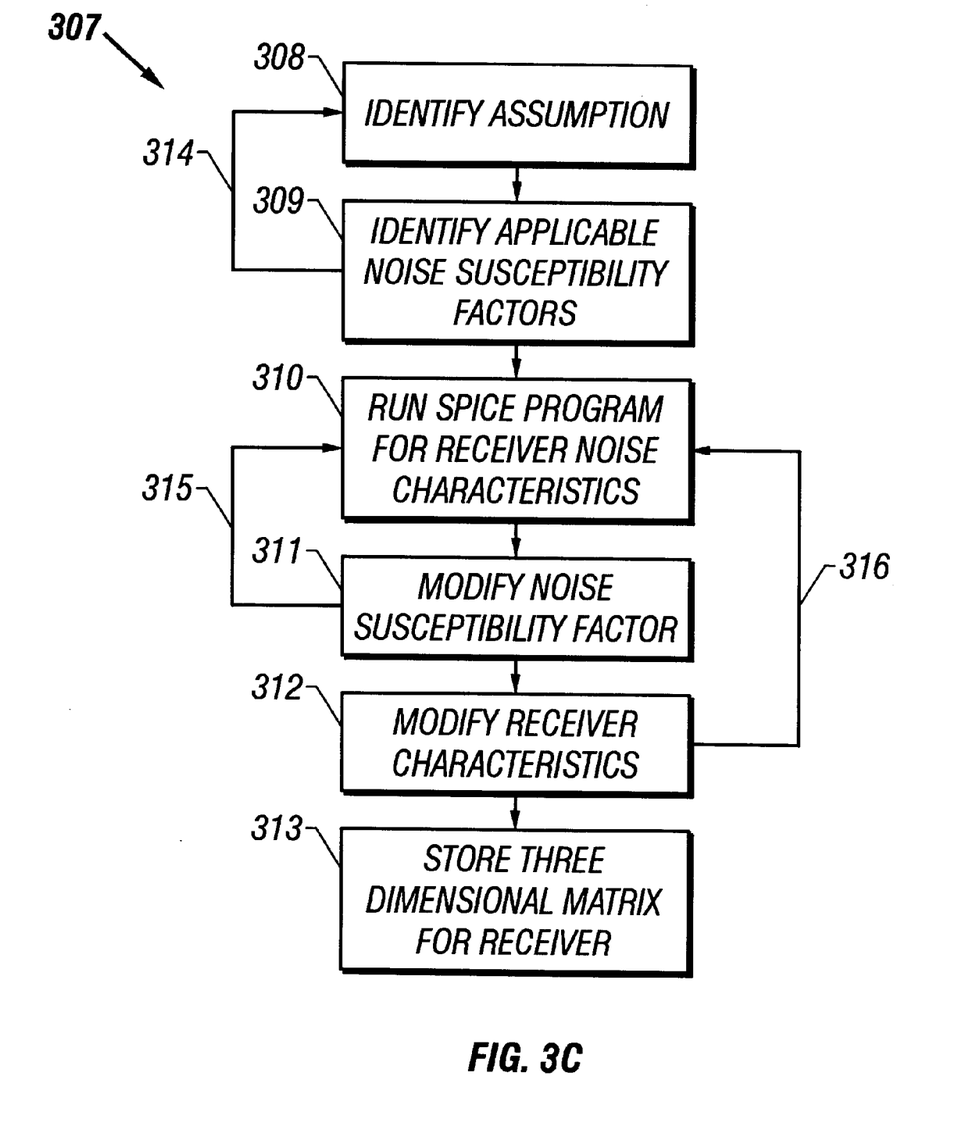
FIG. 3C is a flow diagram showing how noise characteristics are precalculated.

As shown in FIG. 3C, flow 307 shows how noise characteristics for receivers are precalculated. Flow 307 consists of identifying assumptions block 308, identify applicable noise susceptibility factors block 309, run SPICE programs for receiver noise characteristics block 310, modify noise susceptibility factors block 311, modify receiver characteristics block 312 and store 3-dimensional matrix for receiver block 313. In identify assumptions block 308 reasonable assumptions are identified which will ease the calculations, without substantially reducing the accuracy of the results, and a decision is made as to whether or not these assumptions should be incorporated. The assumptions which have been identified and incorporated in block 308 include an assumption that the wires are made of M3 material which will give the worst coupling behavior as a function of length. This assumption ensures that the worst case noise characteristics possible are identified. Additionally, a second assumption as to the driver signal minimum strength for NFET and PFET have been identified. As previously described, the minimum driver strength for NFET is 8 $\mu$m/pf and the minimum driver strength for PFET is 21 $\mu$m/pf.

Identify applicable noise susceptibility factors block 309 is an optional block in which the user of the system can make a determination beforehand of which factors that affect the noise sensitivity are the most critical and which will allow ease of use of the resulting matrix. For example, while the SPICE modeling technique uses 41 parameters per BJT device, the effects of some of these parameters are less important than others. This step is optional in that numerous SPICE iterations can be run and all 41 parameters for BJT can be analyzed to determine which of those parameters have the most effect on the noise characteristics of the BJT. However, if the user can precharacterize those parameters which they believe may be the applicable noise susceptibility factors in block 309 this analysis may be simplified. Feedback between identify applicable noise susceptibility factors 309 and identifying assumptions block 308 through link 315 is available for the modifications of assumptions based on the perceived applicable noise susceptibility factors.

In run SPICE for receiver noise characteristics block 310 the SPICE program is run to determine the noise characteristics for this specific configuration.

In modify noise susceptibility factor block 311, the user changes one of their perceived noise susceptibility factors to determine the effects on the noise characteristics calculated in block 310. If the user has not identified what they believe are applicable noise susceptibility factors in block 309, each of the parameters included in the SPICE model for the specific receiver can be modified to determine which parameters actually affect the noise characteristics.

Once the noise susceptibility factor is modified connector 315 returns to the run SPICE program for receiver noise characteristics block 310 to recalculate the noise characteristics for the updated parameters for the receiver. This interaction between run SPICE program for receiver noise characteristics block 310 and modified noise susceptibility factor 311 is repeated until each of the applicable parameters are thoroughly tested to determine the sensitivity of the noise characteristics on changes in the parameters. Once these sensitivities are determined, modify receiver characteristics block 312 is encountered which modifies the receiver characteristics to determine the new noise susceptibility factors for the updated receiver. Once the receiver characteristics are changed, link 316 returns to run SPICE program for the receiver noise characteristics 310. Once again, run SPICE program for receiver noise characteristics block 310 and modify noise susceptibility factor block 311 through link 315 together fully analyze the noise characteristics of the updated receiver for changes in the noise susceptibility factors. This process is continued until this type of receiver is thoroughly analyzed. Once the receiver is thoroughly analyzed, the results are stored in a 3-dimensional matrix for the receiver in block 313.

Figure 4:
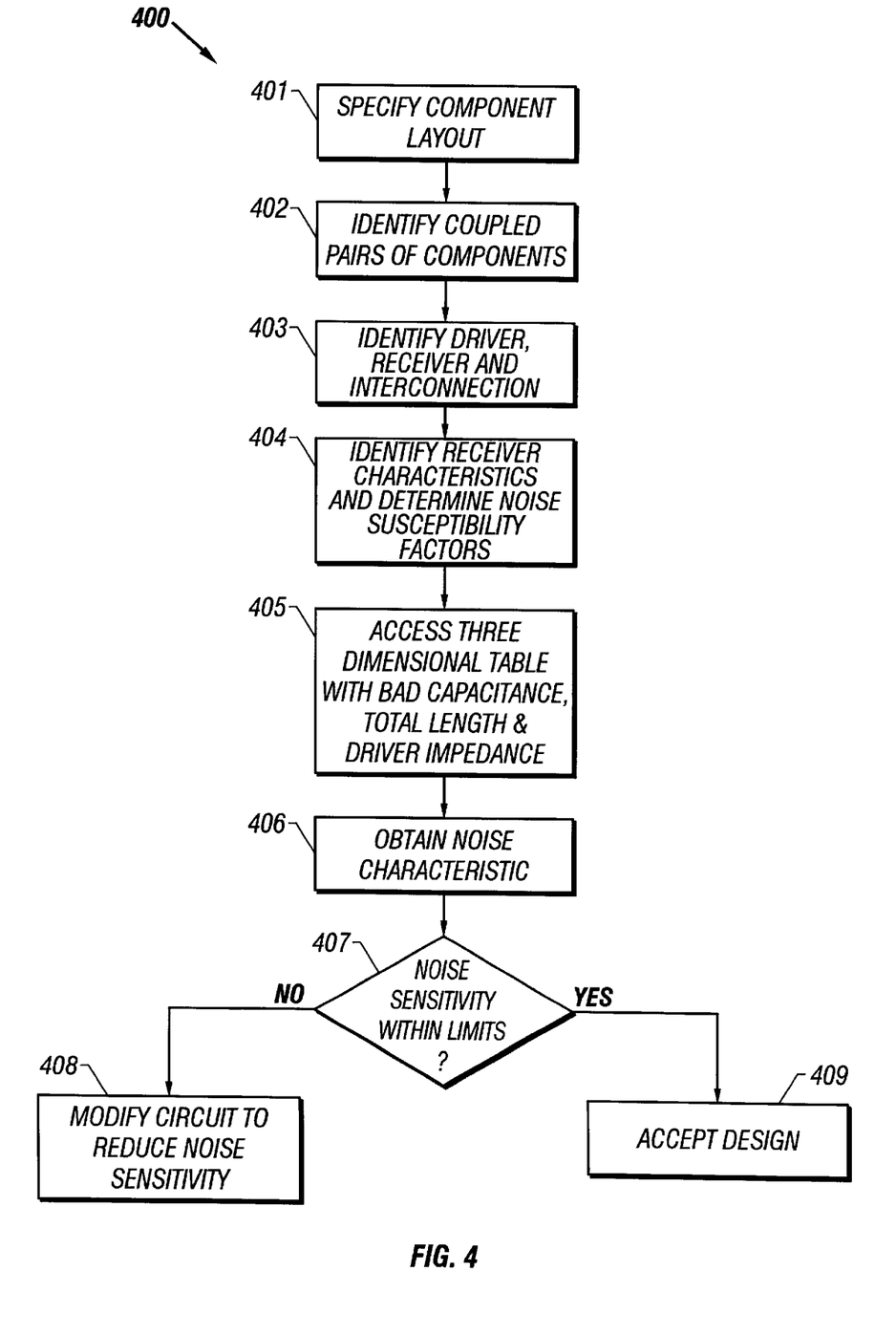
FIG. 4 is a flow diagram showing how precalculated noise characteristics are used.

Once noise characteristics as a function of noise susceptibility factors are determined and stored, FIG. 4 allows these results to be used to identify the noise characteristics for a specific receiver. Flow 400 consists of specify component layout 401, identified coupled pairs of components 402, identify driver, receiver and interconnection 403, identify receiver characteristics and determine noise susceptibility factors 404, access 3-dimensional table with bad capacitance, total length, and drive impedance 405, obtain noise characteristics 406, a decision step in which the question asked is if the noise sensitivity is within the limits block 407 and blocks for if the noise sensitivity is within the limits when the design is accepted in block 409 and a block for when the noise sensitivity is not within the limits which requires a modification in the circuit to reduce the noise sensitivity block 408. As previously described with respect to FIGS. 3A–3C, numerous 3-dimensional matrices are generated for various receivers with various characteristics. In order to determine the correct 3-dimensional matrix to access for this specific receiver, the receiver must be identified in block 403. However, before the receiver can be identified, the component layout must be specified 401 and pairs of coupled components must be identified 402. Within the coupled components the driver, receiver and the interconnection are identified 403. Once the receiver itself is identified the receiver characteristics must be identified to determine which specific 3-dimensional matrix for this type of receiver must be accessed to determine the noise characteristics associated with this specific instance of the receiver. Once the receiver is identified in block 403 and receiver characteristics are identified and the applicable noise susceptibility factors are determined in block 404, a specific 3-dimensional matrix for that receiver with those characteristics is accessed in block 405 with the bad capacitance, the total length of the victim wire susceptible to capacitance loading and the driver impedance. These three factors allow specific noise characteristics to be obtained from the 3-dimensional matrix in block 406. At this point, the noise characteristics could be displayed to the user, or a next step can be taken to determine whether the noise sensitivity is within acceptable limits in Step 407. If the noise sensitivity is within the limits, the design can be accepted as in block 409. If the noise sensitivity is not within the limits the circuit must be modified to reduce the noise characteristics of the circuit in block 408. These modifications may include shielding, movement of a victim wire, movement of an aggressor wire, or some other change in the circuit design to reduce the capacitance coupling felt on the victim wire.

Figure 5:
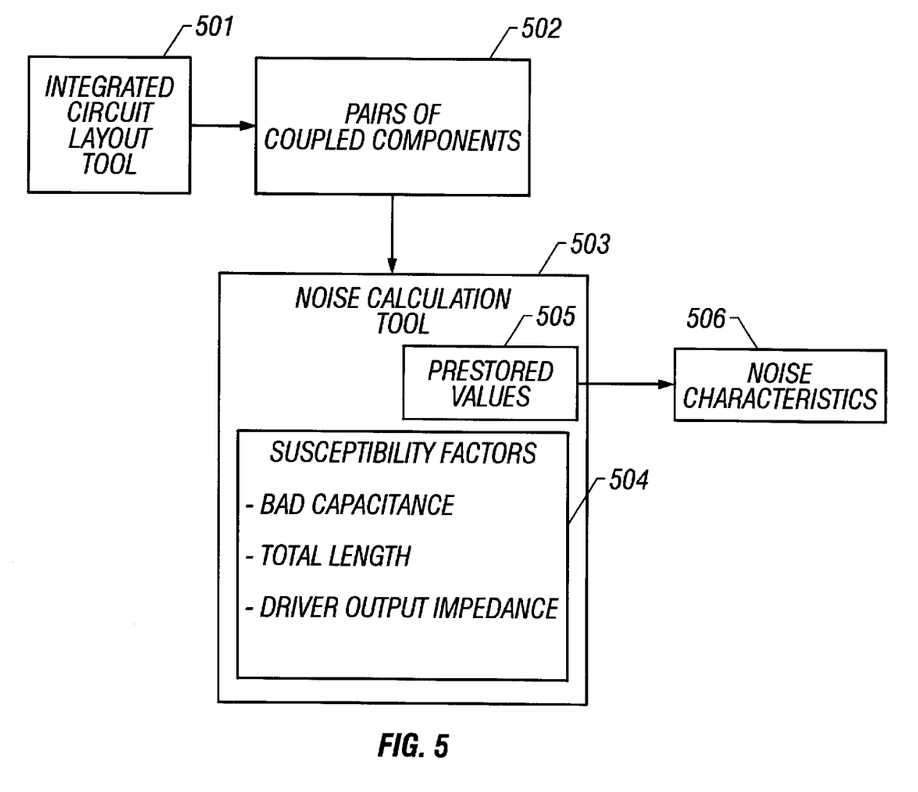
FIG. 5 is a block diagram of a tool for the design of an integrated circuit.

FIG. 5 illustrates a layout of a tool for the design of an integrated circuit. First Integrated Circuit Layout tool 501 is used to layout the integrated circuit. A typical layout will contain any number of coupled components. Within the integrated circuit components are grouped by pairs of coupled components block 502. Using these coupled components, noise calculation tool 503 identifies the values for susceptibility factors 504 which may include a value for bad capacitance, the total length of the victim wire and the output impedance of the driver. These values are then used by noise calculation tool 503 to access prestored values 505 to determine applicable noise characteristics 506.

More specifically, when accessing the three dimensional characterization matrix for a receiver, the maximum transition allowable at the output of the victim receiver is calculated. The maximum transition allowable should be less than a FET Threshold Voltage to ensure the transition, when it occurs, does not propagate the transition to elements connected to the victim receiver output. The total victim wire length and the driver impedance are used to calculate the maximum bad cap percentage which can be present on the victim wire such that the victim output transition amplitude is less than the maximum amplitude variation allowed. If the actual bad cap percentage is less than the maximum bad capacitance percentage, the receiver successfully passes the noise check. If, however, the actual bad capacitance percentage is greater than the maximum bad cap percentage the receiver fails this test. The extent of the failure can also be measured in that the greater the actual bad capacitance percentage is over the maximum bad capacitance, the greater the failure.

Alternatively, the characterization matrix may also be accessed by a determination of the actual transition amplitude at the victim receiver output. This parameter may be calculated by using actual bad capacitance, the total victim wire length and the victim driver impedance. The receiver passes the sensitivity test as long as the actual transition amplitude is less than the maximum allowed transition amplitude.

One of ordinary skill in the art would further understand that the characterization matrix of the present invention is not limited to three dimensions. For instance, the characterization matrix may be expanded to a fourth dimension through the addition of the actual capacitive loading on the victim receiver output. One of ordinary skill in the art would understand that the actual capacitive loading on the victim receiver output will affect the response of the receiver to the noise event. As the loading increases, a smaller response is expected and the receiver would be able to tolerate a higher bad capacitance on the victim wire.

The maximum allowable transition amplitude specification may be relaxed or reduced for certain circuit configurations. If the victim receiver is non-recoverable, meaning it contains a latch node or pre-charge node, no relaxation of the maximum allowable transition amplitude specification is permitted Alternatively, if the victim receiver is recoverable, meaning the static logic gate will always return to the original logic value after the noise event has subsided, the fanout of the victim receiver output may be traversed to identify the shortest path to a non-recoverable node. The maximum allowable transition amplitude may be increased, as a function of the number of recoverable stages which are present between the victim receiver and the non-recoverable node. This increase is because the intermediate stages will attenuate the noise event before it reaches the non-recoverable node.

As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of designing an integrated circuit comprising the steps of:
   specifying a layout of components included in the integrated circuit;
   identifying coupled pairs of said components;
   identifying noise susceptibility factors for each of said pair of coupled components; and
   retrieving prestored noise characteristics using said noise susceptibility factors;
   wherein said step of identifying noise susceptibility factors comprises the steps of:
      determining a percent of bad capacitance to total capacitance of wire coupling said pairs of components; and
      determining said noise characteristics using said percent of capacitance.

2. The method of claim 1 wherein said step of identifying pairs of said components further comprises the steps of:
   identifying a driver, a receiver, and an interconnection therebetween.

3. The method of claim 1 wherein said step of identifying noise susceptibility factors comprises the steps of:
   calculating a total length of each corresponding wires coupling said pairs of components that are subject to capacitive coupling; and
   determining respective noise characteristics using each of said total lengths.

4. The method of claim 1 wherein said step of identifying noise susceptibility factors comprises the steps of:
   calculating a driver output impedance of driving circuits each comprising one of said components of each of said pair of coupled components; and
   determining said noise characteristics using respective one of said driver output impedances.

5. The method of claim 1 wherein said step of identifying noise susceptibility factors comprises the steps of:
   calculating a total length of each of corresponding wires coupling said pairs of components;
   calculating a driver output impedance of driving circuits each comprising one of said components of each of said pair of coupled components; and
   determining respective noise characteristic using said percentage of a bad capacitance to total capacitance, said total length of wire, and said driver output impedance.

6. The method of claim 1 further comprising the step of:
   generating said prestored noise characteristics as a function of said noise susceptibility factors.

7. A tool for the design of an integrated circuit comprising:
   an integrated circuit layout tool providing an integrated circuit layout including a plurality of pairs of coupled components, each pair coupled by a respective wire;
   a noise calculation tool providing noise susceptibility factors for each of said coupled components in said circuit layout; and a noise calculation tool providing parameter noise characteristics of each of said wires using a prestored value retrieved as a function of said noise susceptibility factors;

wherein said noise calculation tool comprises the percent of a bad capacitance to total capacitance of a wire coupling said pairs of components.

8. The tool of claim 7 for the design of an integrated circuit wherein:

said integrated circuit layout provided comprises semiconductor devices.

9. The tool of claim 7 for the design of an integrated circuit wherein:

said noise calculation tool comprises an total length of each of corresponding wires coupling said pairs of components that are subject to parasitic capacitance.

10. The tool of claim 7 for the design of an integrated circuit wherein:

said noise calculation tool comprises a driver output impedance of driving circuits each comprising one of said components of each of said pair of coupled components.

11. The tool of claim 7 for the design of an integrated circuit wherein:

said noise calculation tool comprises an total length of each of corresponding wires coupling said pairs of components that are subject to parasitic capacitance; and said noise calculation tool comprises a driver output impedance of driving circuits each comprising one of said components of each of said pair of coupled components.

12. An integrated circuit formed by the steps of:

specifying a layout of components included in the integrated circuit;

identifying coupled pairs of said components;

identifying noise susceptibility factors for each of said pair of coupled components; and retrieving prestored noise characteristics using said noise susceptibility factors;

wherein said noise susceptibility factor further comprises the percent of bad capacitance to total capacitance of a wire coupling said pairs of components.

13. The integrated circuit of claim 12 wherein pairs of said coupled components further comprises:

a driver;

a receiver; and an interconnection therebetween.

14. The integrated circuit of claim 12 wherein said noise susceptibility factors further comprises:

an total length of each of corresponding wires coupling said pairs of components that are subject to bad capacitance coupling.

15. The integrated circuit of claim 12 wherein said noise susceptibility factor further comprises:

a driver output impedance of driving circuits each comprising one of said components of each of said pair of coupling components.

16. The integrated circuit of claim 12 wherein said noise susceptibility factor further comprises:

an total length of each of corresponding wires coupling said pairs of components that are subject to bad capacitance coupling; and a driver output impedance of driving circuits each comprising one of said components of each of said pair of coupling components.

* * * * *